(12) United States Patent
Pan et al.

(10) Patent No.: US 11,824,476 B2
(45) Date of Patent: Nov. 21, 2023

(54) CIRCUIT FOR CONVERTING TEMPERATURE CHANGE AMOUNT INTO VOLTAGE CHANGE IN MOTOR DRIVE SYSTEM

(71) Applicant: Hefei Aichuangwei Electronic Technology Co., Ltd., Anhui (CN)

(72) Inventors: Jun Pan, Hefei (CN); Lixiang Xu, Hefei (CN); Lixiang Wen, Hefei (CN); Lei Qiu, Hefei (CN); Dianwu Li, Hefei (CN); Wei Wang, Hefei (CN); Lei Han, Hefei (CN); Ke Wang, Hefei (CN)

(73) Assignee: Hefei Aichuangwei Electronic Technology Co., Ltd., Hefei (CN)

( * ) Notice: Subject to any disclaimer, the term of this patent is extended or adjusted under 35 U.S.C. 154(b) by 67 days.

(21) Appl. No.: 17/552,910

(22) Filed: Dec. 16, 2021

(65) Prior Publication Data

US 2023/0125761 A1  Apr. 27, 2023

(30) Foreign Application Priority Data

Oct. 22, 2021  (CN) .......................... 202111236022.4

(51) Int. Cl.
*H02P 29/68* (2016.01)
*H02M 1/32* (2007.01)
*H03K 19/0948* (2006.01)

(52) U.S. Cl.
CPC ............ *H02P 29/68* (2016.02); *H02M 1/327* (2021.05); *H03K 19/0948* (2013.01)

(58) Field of Classification Search
CPC ..... H02P 29/68; H02M 1/327; H03K 19/0948
See application file for complete search history.

(56) References Cited

U.S. PATENT DOCUMENTS

| | | | |
|---|---|---|---|
| 6,285,150 B1* | 9/2001 | Adam | F04D 27/004 318/473 |
| 2008/0044165 A1* | 2/2008 | Miyajima | H02P 7/29 388/819 |
| 2015/0236592 A1* | 8/2015 | Inoue | H02P 29/68 318/445 |
| 2015/0370279 A1* | 12/2015 | Akahane | G05F 3/185 327/541 |
| 2018/0294638 A1* | 10/2018 | Jiang | H02H 1/0007 |

* cited by examiner

*Primary Examiner* — Rina I Duda
(74) *Attorney, Agent, or Firm* — Kirk A. Wilson; Joseph T. Guy; Patent Filing Specialist Inc.

(57) ABSTRACT

Disclosed is a circuit for converting a temperature change amount into a voltage change amount in a motor drive system, including a positive temperature change rate voltage generation module, a circuit bias module, and a temperature detection module that are integrated on a same substrate. An external power supply voltage is processed by the positive temperature change rate voltage generation module and the circuit bias module, and then inputted to the temperature detection module. The temperature detection module detects in real time the temperature change amount in the motor drive system, convert the temperature change amount into the voltage change amount, and transfer the voltage change amount to the circuit bias module, to allow the circuit bias module to output the voltage change amount. In this way, the conversion from the temperature change amount into the voltage change amount is realized.

3 Claims, 3 Drawing Sheets

CIRCUIT FOR CONVERTING TEMPERATURE CHANGE AMOUNT INTO VOLTAGE CHANGE IN MOTOR DRIVE SYSTEM

CROSS REFERENCE TO RELATED APPLICATION

This patent application claims the benefit and priority of Chinese Patent Application No. 202111236022.4, filed on Oct. 22, 2021, the disclosure of which is incorporated by reference herein in its entirety as part of the present application.

TECHNICAL FIELD

The present invention relates to the field of semiconductor integrated circuit design technologies, and in particular, to a circuit for converting a temperature change amount into a voltage change amount in a motor drive system.

BACKGROUND ART

Temperatures of various drive systems need to be detected in real time during actual applications. Especially in the field of motor drive system design, temperature protection cannot be applied timely and effectively for motor components in the absence of the real-time temperature detection. In addition, a physical quantity directly required by the motor drive system to implement the temperature protection for the motor components is an electrical signal physical quantity rather than a temperature physical quantity. Therefore, it is necessary to convert related physical quantities.

SUMMARY

An objective of the present disclosure is to provide a circuit for converting a temperature change amount into a voltage change amount in a motor drive system, aiming to solve the problem described in the background art.

To achieve the above objective, the present disclosure uses the following technical solutions.

A circuit for converting a temperature change amount into a voltage change amount in a motor drive system, including: a positive temperature change rate voltage generation module, a circuit bias module, and a temperature detection module, which are integrated on a same substrate. An external power supply voltage is processed by the positive temperature change rate voltage generation module and the circuit bias module, and then inputted to the temperature detection module. The temperature detection module detects in real time the temperature change amount in the motor drive system, convert the temperature change amount into the voltage change amount, and transfer the voltage change amount to the circuit bias module, to allow the circuit bias module to output the voltage change amount.

Further, the positive temperature change rate generation module is provided with a resistor R0 having a positive temperature property. An end of the resistor R0 is externally connected to a power supply, and the other end of the resistor R0 is configured as an output terminal of the positive temperature change rate generation module for outputting a voltage VA. The voltage VA has a directly proportional relationship with a temperature value of the motor drive system.

Further, a power supply terminal of the circuit bias module is grounded, an input terminal of the circuit bias module is connected to the voltage VA, an output terminal of the circuit bias module is configured to output a voltage VB, and another output terminal of the circuit bias module is externally connected to an OUT output terminal.

Further, the circuit bias module includes bipolar junction transistors Q0 and Q1, metal-oxide semiconductor (MOS) transistors M0, M1, M2, M3 and M4, and a built-in voltage source VBIAS. An emitter of the bipolar junction transistor Q0 is configured as an input terminal of the circuit bias module for connecting to the voltage VA. A base of the bipolar junction transistor Q0 is connected to a source of the MOS transistor M0 and a base of the bipolar junction transistor Q1 respectively. A collector of the bipolar junction transistor Q0 is connected to a source of the MOS transistor M1. An emitter of the bipolar junction transistor Q1 is configured to output the voltage VB. A collector of the bipolar junction transistor Q1 is connected to a source of the MOS transistor M2. A gate of the MOS transistor M0 is connected to a gate of the MOS transistor M1 and a gate of the MOS transistor M2. A drain of the MOS transistor M0, a negative electrode of the built-in voltage source VBIAS, a source of the MOS transistor M3 and a source of the MOS transistor M4 are connected and then grounded together. The gate of the MOS transistor M1 is short-circuited to a drain of the MOS transistor M1, and the drain of the MOS transistor M1 is also connected to a drain of the MOS transistor M3. A drain of the MOS transistor M2 is connected to a drain of the MOS transistor M4, and is externally connected to the OUT output terminal. A gate of the MOS transistor M3 is connected to a positive electrode of the built-in voltage source VBIAS and a gate of the MOS transistor M4.

Further, a power supply terminal of the temperature detection module is externally connected to the power supply, and an input terminal of the temperature detection module is connected to the voltage VB. The temperature detection module is provided with a diode D0 that is able to convert the temperature change amount of the motor drive system into an electrical signal physical quantity, and a current capability of the diode D0 is in a positive correlation with a temperature value of the motor drive system.

In accordance with the foregoing technical solutions, the conversion from the temperature change amount into the voltage change amount is realized. The present disclosure may implement real-time temperature detection for the motor drive system, and at the same time construct an expected inflection point waveform reflecting the temperature change according to a specific application requirement of the motor drive, thereby being advantageous of further optimizing the design of the motor drive system.

In the figures: 1. Positive temperature change rate voltage generation module; 2. Circuit bias module; and 3. Temperature detection module.

DETAILED DESCRIPTION OF THE EMBODIMENTS

Embodiments of the present disclosure are described in detail below with reference to the accompanying drawings.

Figure 1:
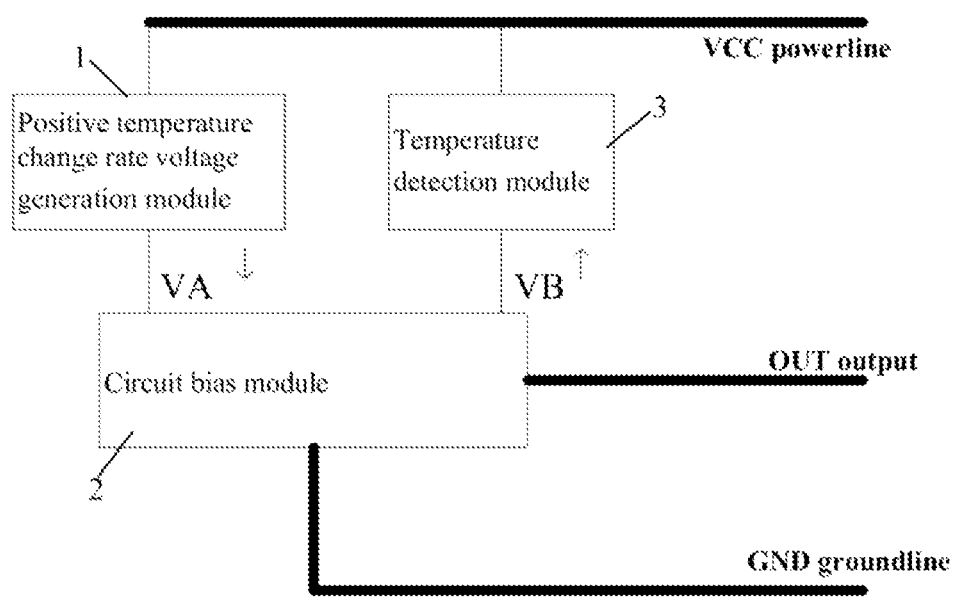
FIG. 1 is a schematic diagram showing module connection of a circuit according to the present disclosure.

As shown in FIG. 1, a circuit for converting a temperature change amount into a voltage change amount in a motor drive system includes a positive temperature change rate voltage generation module, a circuit bias module, and a temperature detection module, three of which are integrated on a same substrate. An external power supply voltage is processed by the positive temperature change rate voltage generation module and the circuit bias module, and then inputted to the temperature detection module. The temperature detection module is used to detect in real time a temperature change amount in the motor drive system, convert the temperature change amount into a voltage change amount, and transfer the voltage change amount to the circuit bias module, to allow the circuit bias module to output the voltage change amount. In the present disclosure, a VCC powerline, an OUT output, and a GND groundline are used to characterize an application detail of the circuit.

Figure 2:
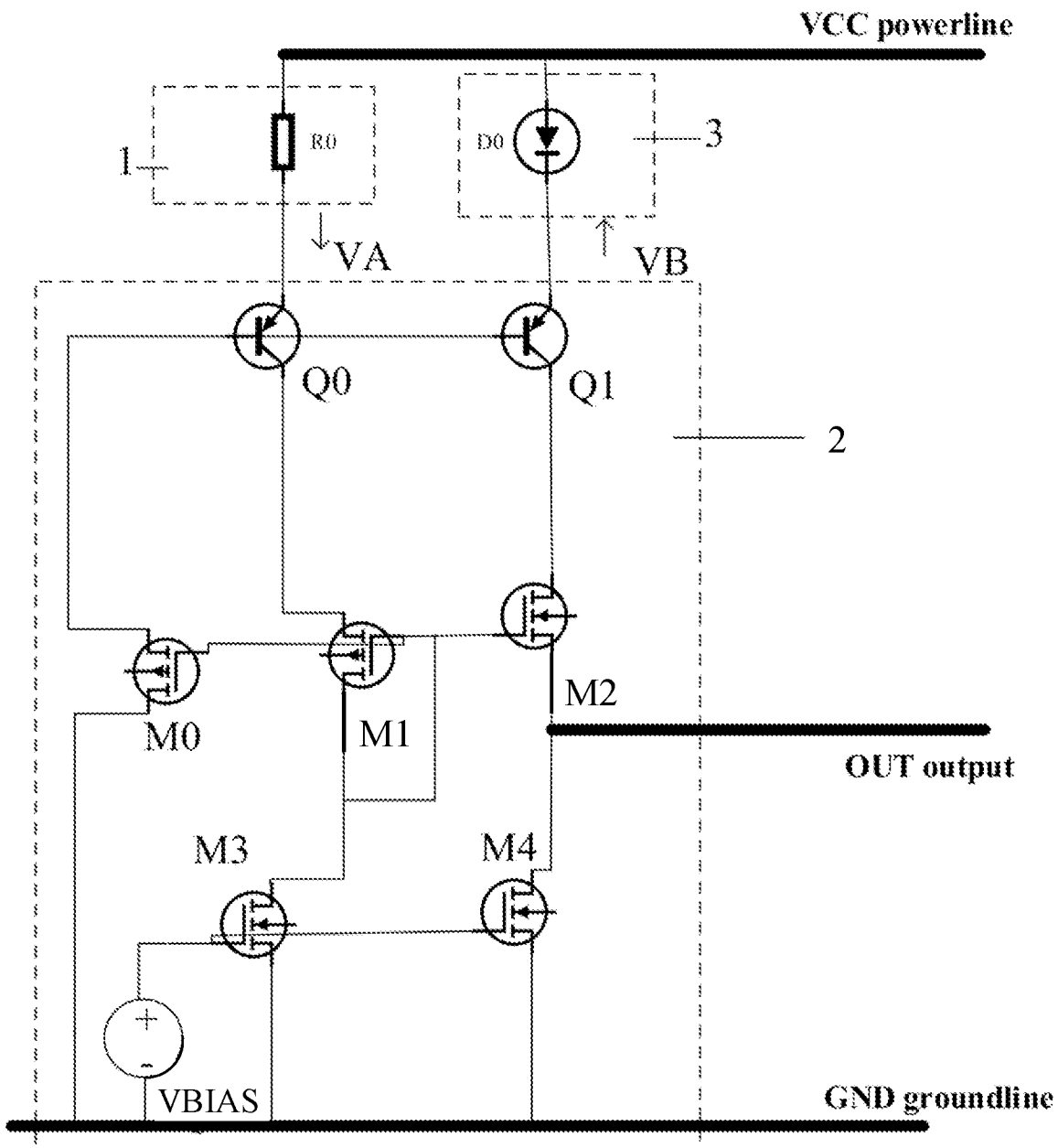
FIG. 2 is a schematic diagram showing specific circuit connection according to the present disclosure.

Specifically, as shown in FIG. 2, the positive temperature change rate generation module is provided with a resistor R0 having a positive temperature property. An end of the resistor R0 is externally connected to the VCC powerline, and the other end of the resistor R0 is used as an output terminal of the positive temperature change rate generation module for outputting a voltage VA. The voltage VA also has a positive temperature property. The voltage VA has a directly proportional relationship with a temperature value of the motor drive system. A specific proportional relationship is determined by a design of an internal parameter of the positive temperature change rate voltage generation module, which corresponds to the meaning of a positive temperature change rate voltage characterized by the positive temperature change rate voltage generation module. A reasonable design of the specific parameter of the resistance R0 having the positive temperature property allows the voltage VA to satisfy an expected parameter value.

In an embodiment, a power supply terminal of the circuit bias module is grounded, an input terminal of the circuit bias module is connected to the voltage VA, an output terminal of the circuit bias module outputs a voltage VB, and another output terminal of the circuit bias module is externally connected to the OUT output. Specifically, the circuit bias module includes bipolar junction transistors Q0 and Q1, MOS transistors M0, M1, M2, M3 and M4, and a built-in voltage source VBIAS. An emitter of the bipolar junction transistors Q0 is used as an input terminal of the circuit bias module for connecting to the voltage VA. A base of the bipolar junction transistors Q0 is connected to a source of the MOS transistor M0 and a base of the bipolar junction transistor Q1 respectively. A collector of the bipolar junction transistors Q0 is connected to a source of the MOS transistor M1. An emitter of the bipolar junction transistor Q1 is used to output the voltage VB. A collector of the bipolar junction transistor Q1 is connected to a source of the MOS transistor M2. A gate of the MOS transistor M0 is connected to a gate of the MOS transistor M1 and a gate of the MOS transistor M2. A drain of the MOS transistor M0, a negative electrode of the built-in voltage source VBIAS, a source of the MOS transistor M3 and a source of the MOS transistor M4 are connected and then connected to the GND groundline together. The gate of the MOS transistor M1 is short-circuited to a drain of the MOS transistor M1, and the drain of the MOS transistor M1 is also connected to a drain of the MOS transistor M3. A drain of the MOS transistor M2 is connected to a drain of the MOS transistor M4, and also externally connected to the OUT output terminal. A gate of the MOS transistor M3 is connected to a positive electrode of the built-in voltage source VBIAS and a gate of the MOS transistor M4.

In an embodiment, a power supply terminal of the temperature detection module is externally connected to the power supply, and an input terminal of the temperature detection module is connected to the voltage VB. The temperature detection module is provided with a diode D0, which is able to convert the temperature change amount of the motor drive system into an electrical signal physical quantity. A current capability of the diode D0 is in a positive correlation with the temperature value of the motor drive system. Specifically, when there is an increase in the temperature of the motor drive system, the current capability of the diode D0 becomes stronger under the same bias voltage condition; and when there is a decrease in the temperature of the motor drive system, the current capability of the diode D0 becomes weaker under the same bias voltage condition. In addition, the bias voltage condition of the diode D0 is also associated with the input voltage VB at the input terminal of the temperature detection module.

A specific working process of the conversion circuit according to the present disclosure is as follows:

First, the built-in voltage source VBIAS in the circuit bias module applies a reasonable bias condition to the MOS transistors M3 and M4, to make the MOS transistors M3 and M4 in set operating regions, further making the MOS transistors M0, M1 and M2 also in expected operating regions.

Next, the voltage VA that is outputted by the positive temperature change rate voltage generation module and satisfies an expected parameter value is inputted to the input terminal of the circuit bias module, namely the emitter of the bipolar junction transistors Q0 in the circuit bias module. After the voltage VA is processed by the MOS transistors M0, M1, M2, M3 and M4 that have been set to the expected operating regions, the emitter of the bipolar junction transistors Q0 in the circuit bias module outputs the voltage VB associated with the voltage VA.

Figure 3:
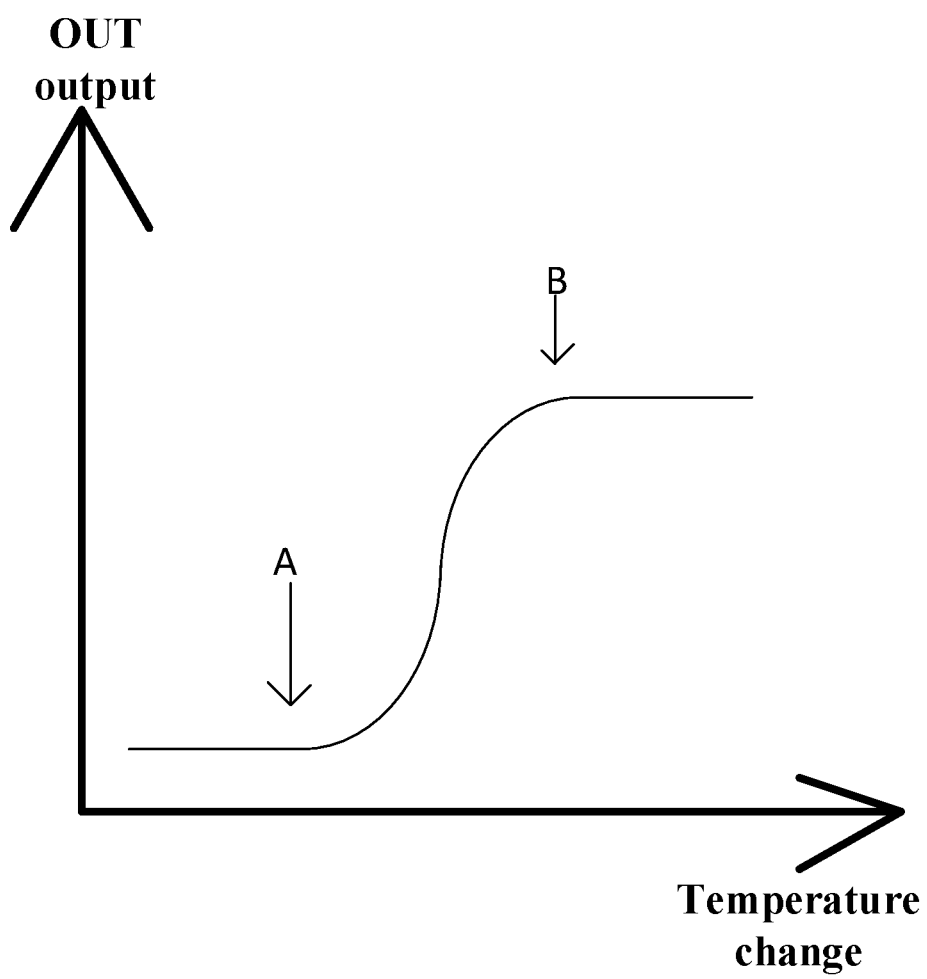
FIG. 3 is a waveform diagram showing conversion from a temperature change amount into a voltage change amount according to the present disclosure.

Then, the voltage VB is used to control the change of the bias voltage of the diode D0 in the temperature detection module, so as to form the change of the output voltage outputted from the circuit bias module to the OUT output terminal, thus completing the conversion from the temperature change amount to the voltage change amount in the motor drive. A specific waveform diagram showing the conversion from the temperature change amount into the voltage change amount is as shown in FIG. 3.

Particularly, when the design has been artificially changed and thus a specific positive temperature property parameter indicator of the resistor R0 having the positive temperature property in the positive temperature change rate voltage generation module changes, the inflection points A and B in the foregoing waveform showing the conversion from the temperature change amount into the voltage change amount perform a preset translation action synchronously. In this way, an expected inflection point waveform that reflects the temperature change may be constructed according to a specific application requirement of the motor drive, which is conducive to optimizing the design of the motor drive system.

The above embodiments are merely intended to describe the preferred embodiments of the present disclosure rather than to limit the scope of the present disclosure. Various alterations and improvements made by those of ordinary skill in the art based on the technical solution of the present disclosure without departing from the design spirit of the present disclosure shall fall within the protection scope of the claims of the present disclosure.

What is claimed is:

1. A circuit for converting a temperature change amount into a voltage change amount in a motor drive system, comprising: a positive temperature change rate voltage generation module, a circuit bias module, and a temperature detection module that are integrated on a same substrate; wherein an external power supply voltage is processed by the positive temperature change rate voltage generation module and the circuit bias module, and then inputted to the temperature detection module; and the temperature detection module is configured to detect in real time the temperature change amount in the motor drive system, convert the temperature change amount into the voltage change amount, and transfer the voltage change amount to the circuit bias module, to allow the circuit bias module to output the voltage change amount;

wherein a power supply terminal of the circuit bias module is grounded, an input terminal of the circuit bias module is connected to a voltage VA, an output terminal of the circuit bias module is configured to output a voltage VB, and another output terminal of the circuit bias module is externally connected to an OUT output terminal;

wherein the circuit bias module comprises bipolar junction transistors Q0 and Q1, metal-oxide semiconductor (MOS) transistors M0, M1, M2, M3 and M4, and a built-in voltage source VBIAS; wherein an emitter of the bipolar junction transistor Q0 is used as the input terminal of the circuit bias module for connecting to the voltage VA; a base of the bipolar junction transistor Q0 is connected to a source of the MOS transistor M0 and a base of the bipolar junction transistor Q1 respectively; a collector of the bipolar junction transistor Q0 is connected to a source of the MOS transistor M1; an emitter of the bipolar junction transistor Q1 is configured to output the voltage VB, a collector of the bipolar junction transistor Q1 is connected to a source of the MOS transistor M2; a gate of the MOS transistor M0 is connected to a gate of the MOS transistor M1 and a gate of the MOS transistor M2; a drain of the MOS transistor M0, a negative electrode of the built-in voltage source VBIAS, a source of the MOS transistor M3 and a source of the MOS transistor M4 are connected and then grounded together; the gate of the MOS transistor M1 is short-circuited to a drain of the MOS transistor M1, and the drain of the MOS transistor M1 is also connected to a drain of the MOS transistor M3; a drain of the MOS transistor M2 is connected to a drain of the MOS transistor M4 and then externally connected to the OUT output terminal; and a gate of the MOS transistor M3 is connected to a positive electrode of the built-in voltage source VBIAS and a gate of the MOS transistor M4.

2. The circuit for converting a temperature change amount into a voltage change amount in a motor drive system according to claim 1, wherein the positive temperature change rate generation module is provided with a resistor R0 having a positive temperature property; wherein an end of the resistor R0 is externally connected to a power supply, and the other end of the resistor R0 is used as an output terminal of the positive temperature change rate generation module for outputting a voltage VA, the voltage VA having a directly proportional relationship with a temperature value of the motor drive system.

3. The circuit for converting a temperature change amount into a voltage change amount in a motor drive system according to claim 1, wherein a power supply terminal of the temperature detection module is externally connected to a power supply, and an input terminal of the temperature detection module is connected to a voltage VB; and the temperature detection module is provided with a diode D0 that is able to convert the temperature change amount of the motor drive system into an electrical signal physical quantity, a current capability of the diode D0 being in a positive correlation with a temperature value of the motor drive system.

* * * * *